(12) United States Patent
Chang

(10) Patent No.: US 7,177,160 B2
(45) Date of Patent: Feb. 13, 2007

(54) CIRCUIT BOARD CLAMPING DEVICE

(75) Inventor: Hsien-Te Chang, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/091,974

(22) Filed: Mar. 28, 2005

(65) Prior Publication Data

US 2006/0215374 A1    Sep. 28, 2006

(51) Int. Cl.
*H05K 7/02* (2006.01)
*B65D 81/24* (2006.01)

(52) U.S. Cl. ........................ 361/810; 206/707

(58) Field of Classification Search ............. 361/801, 361/778, 779, 614, 615, 726, 728, 732, 730, 361/740, 747, 754, 759, 752, 757; 206/707, 206/706, 701, 708
See application file for complete search history.

(56) References Cited

U.S. PATENT DOCUMENTS

| 3,058,440 A | * | 10/1962 | Berry | 228/19 |
| 3,759,436 A | * | 9/1973 | Foster et al. | 228/57 |
| 4,012,155 A | * | 3/1977 | Morris | 403/290 |
| 4,730,819 A | * | 3/1988 | Hirschhorn et al. | 269/221 |
| 4,909,429 A | * | 3/1990 | Ankrom et al. | 228/57 |
| 5,390,083 A | * | 2/1995 | Decker et al. | 361/796 |
| 5,956,835 A | * | 9/1999 | Aksu | 29/468 |
| 6,543,098 B2 | * | 4/2003 | Meyer et al. | 24/289 |

* cited by examiner

*Primary Examiner*—Dean A. Reichard
*Assistant Examiner*—Hung Nguyen
(74) *Attorney, Agent, or Firm*—Peter F. Corless; Steven M. Jensen; Edwards Angell Palmer & Dodge LLP

(57) ABSTRACT

A circuit board clamping device is applied to at least two spaced and stacked circuit boards, wherein the two circuit boards are spaced apart and fixed by a plurality of spacing posts. The circuit board clamping device includes a securing member, a pressing member and a forcing member. The securing member can be disposed on one of the circuit boards and adjacent to the spacing posts. The pressing member can be disposed on the securing member and is used to press the spacing posts. The forcing member is disposed on the pressing member and is engaged with the pressing member. The two circuit boards are securely stacked and coupled to each other by the pressing member pressing the spacing posts.

15 Claims, 4 Drawing Sheets

CIRCUIT BOARD CLAMPING DEVICE

FIELD OF THE INVENTION

The present invention relates to clamping devices, and more particularly, to a circuit board clamping device for clamping at least two circuit boards.

BACKGROUND OF THE INVENTION

For promoting the processing capability of an electronic device (such as a computer), the mainboard of the electronic device is usually provided with many additional function circuits, Such function circuits may share the same layout with the mainboard or may be laid on another independent circuit board. In the case of employing the another independent circuit board for promoting processing capability, a plurality of spacing posts are usually provided on the mainboard to cooperatively support the circuit board, such that the circuit board can be stacked on the mainboard.

However, in order to achieve easy assembly and disassembly and save costs, plastic spacing posts are often used, and their strengthen is not sufficient to allow the additional circuit board to be firmly stacked on the mainboard. If metallic spacing posts are used instead, the metallic spacing posts may easily come into contact with components arranged in high density on the circuit board and the mainboard can cause short circuit, thereby damaging the computer.

Furthermore, when the conventional technology of only using spacing posts as spacing and securing elements is employed in assembly and disassembly processes of a circuit board with high-density arranged components, not only the spacing posts having small volume are not convenient for assembly and disassembly, but also under the limited space, fingers may easily come into contact with the components of the circuit board, thereby resulting in damage to the components due to static electricity.

Moreover, the space in the mainboard with high-density arranged components is very limited for accommodating the spacing posts, such that spacing posts with a larger diameter can hardly be used, but spacing posts with a smaller diameter should be adopted. Consequently, the conventional technology of only using spacing posts as spacing and securing elements cannot provide stable engaging strength, making the overlying circuit board easily subject to shaking.

Therefore, the problem to be solved here is to provide a clamping device for clamping at least two circuit boards, such that the two circuit boards can be securely stacked and coupled to each other, so as to prevent the circuit boards or components thereof from short circuiting due to contact with spacing and securing elements, and achieve easy assembly and disassembly.

SUMMARY OF THE INVENTION

In light of the above drawbacks in the prior art, an objective of the present invention is to provide a circuit board clamping device for allowing at least two circuit boards to be stacked and firmly coupled to each other.

Another objective of the present invention is to provide a circuit board clamping device, for preventing circuit boards or components thereof from short circuiting due to contact with spacing and securing elements.

A further objective of the present invention is to provide a circuit board clamping device, which is easily assembled and disassembled.

In accordance with the above and other objectives, the present invention proposes a circuit board clamping device applied at least two spaced and stacked circuit boards, wherein the two circuit boards are spaced apart and fixed by a plurality of spacing posts. The circuit board clamping device comprises: a securing member for being disposed on one of the circuit boards and adjacent to the spacing posts, wherein the securing member has a first engagement portion on a top portion thereof; a pressing member disposed on the securing member and for pressing the spacing posts, wherein the pressing member has a through hole; and a forcing member disposed on the pressing member, wherein a bottom portion of the forcing member has a second engagement portion for penetrating the through hole and being engaged with the first engagement. The two circuit boards can be securely stacked and coupled to each other by the pressing member pressing the spacing posts.

The first engagement portion and the second engagement portion comprise first threads and second treads respectively to be engaged with each other. Preferably, the first threads are inner threads, and the second threads are outer threads.

The securing member comprises a post structure, and the first engagement portion is located at a central position of the top portion of the securing member. Preferably, the securing member comprises an insulating tube with a screw nut being received therein. The securing member has two parallel cutting surfaces respectively at two lateral sides thereof, by which the securing member can be held when being assembled.

The pressing member has a laterally extended pressing portion for pressing the spacing posts. Preferably, the pressing portion has at least a recess at a bottom surface thereof to be engaged with the spacing posts.

A fastening ring is provided between the second engagement portion of the forcing member and the bottom portion of the pressing member, for preventing separation of the forcing member from the pressing member. The forcing member comprises a neck portion for being engaged with the fastening ring. Additionally, the forcing member comprises an operating portion located on the pressing member, wherein an outer surface of the operating portion is a rough surface comprising an embossed structure. Preferably, the forcing member is a bolt having a head.

Furthermore, the securing member and the pressing member are both insulators. The insulating securing member is located adjacent to the spacing posts, and the insulating pressing member covers and presses top portions of the spacing posts, such that the circuit boards or components thereof can be prevented from short circuiting due to contact with spacing and securing components in the prior art.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
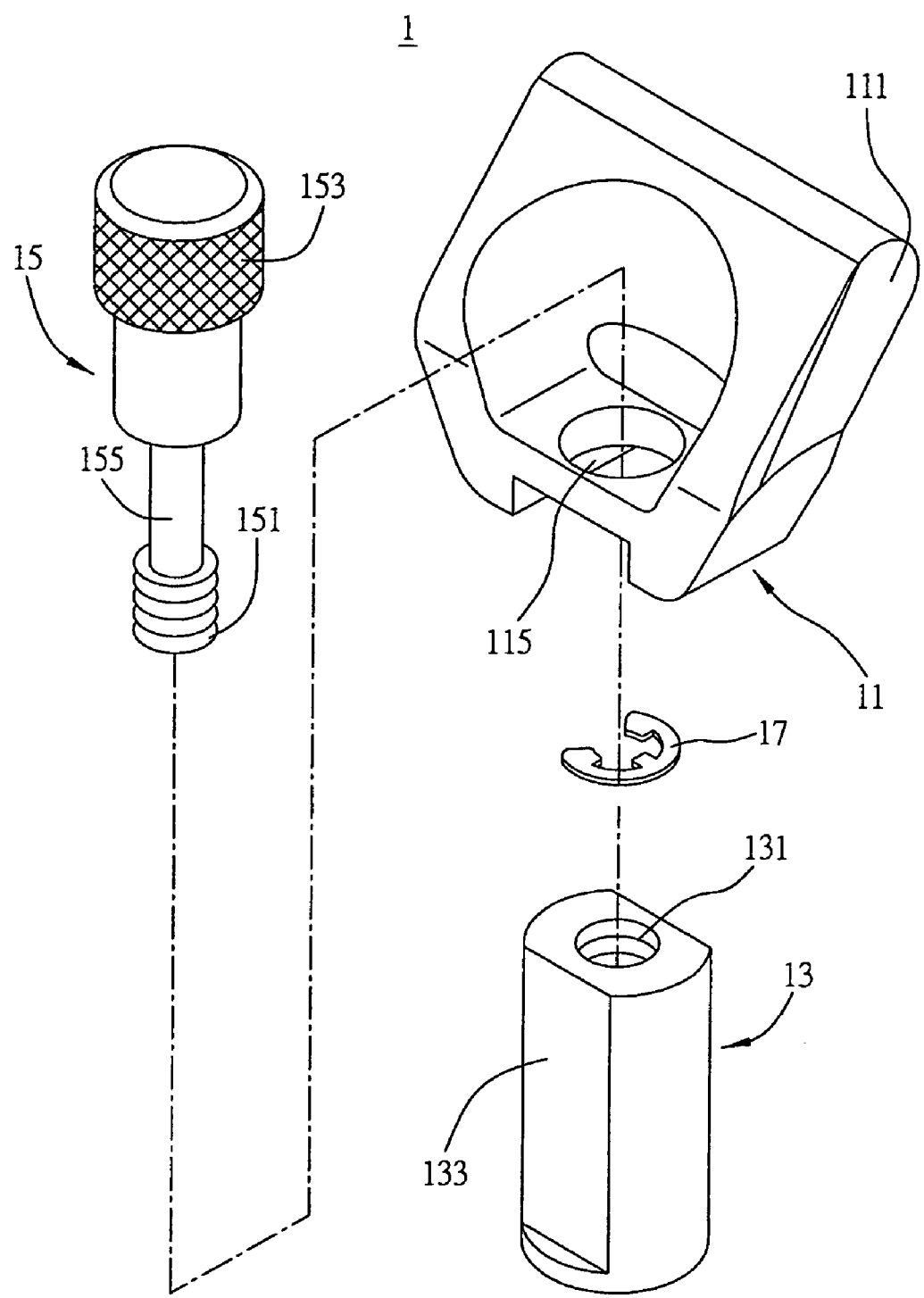
FIG. 1 is an exploded schematic diagram of a circuit board clamping device according to the present invention.
Figure 2:
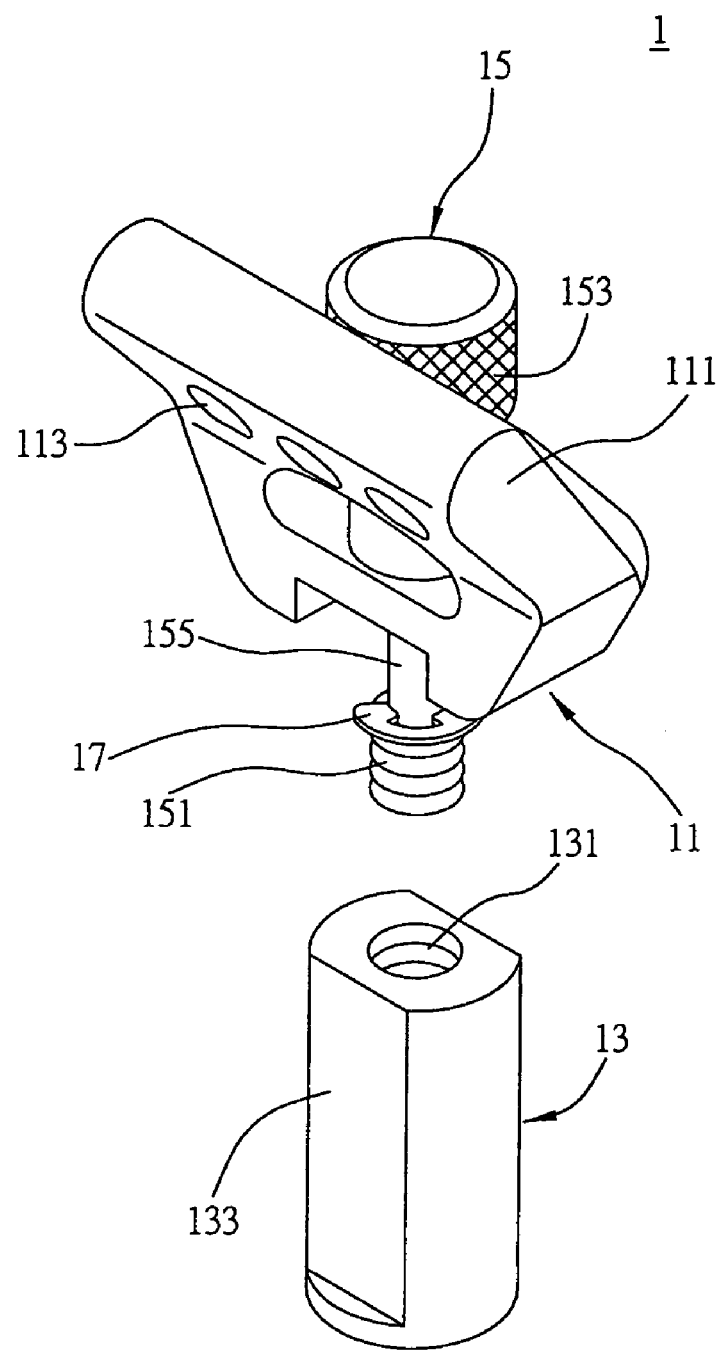
FIG. 2 is a partly exploded schematic diagram of the circuit board clamping device according to the present invention.

Referring to FIGS. 1 and 2, a circuit board clamping device 1 proposed in the present invention comprises a pressing member 11, a securing member 13 and a forcing member 15. In this embodiment, the pressing member 11 and the securing member 13 are both insulators made of, for example, a plastic material, and the forcing member 15 can be a bolt made of, for example, a metallic material.

The pressing member 11 has a through hole 115 where the forcing member 15 can penetrate. A top portion of the pressing member 11 is formed with a laterally extended pressing portion 111, and a bottom surface of the pressing portion 111 has one or more recesses 113.

A top portion of the securing member 13 has a first engagement portion 131 at a central position thereof, and the securing member 13 has two parallel cutting surfaces 133 respectively at two lateral sides thereof, such that the securing member 13 can be held when being assembled. In this embodiment, the first engagement portion 131 can comprise for example inner threads. In practical fabrication, the securing member 13 can comprise an insulating tube made of for example a plastic material, with a screw nut made of a metallic material being received in the insulating tube, such that better engagement strength can be provided, and the first engagement portion 131 made of for example a plastic material from being damaged (gear collapse) due to frequent engaging operation.

The forcing member 15 is disposed on the pressing member 11. The forcing member 15 comprises a second engagement portion 151 at a bottom portion thereof, wherein the second engagement portion 151 can penetrate the through hole 115 and be engaged with the first engagement portion 131; and an operating portion 153 at a top portion of the forcing member 15; and a neck portion 155 formed between the operating portion 153 and the second engagement portion 151. In this embodiment, the second engagement portion 151 comprises outer threads; an outer surface of the operating portion 153 is a rough surface comprising such as an embosses structure; and preferably the height of the neck portion 155 is substantially equal to the sum of the height of the second engagement portion 151 and the depth of the through hole 115.

In addition, after the second engagement portion 151 of the forcing member 15 penetrates the through hole 115 of the pressing member 11, a fastening ring 17 such as a C-shaped fastening ring is provided around the neck portion 155. As the inner diameter of the fastening ring 17 is substantially equal to the outer diameter of the neck portion 155, and the outer diameter of the fastening ring 17 is greater than the diameter of the through hole 115, separation of the forcing member 15 from the pressing member 11 can thus be prevented; moreover, the upward and downward movable distance of the forcing member 15 is limited to the movable distance of the neck portion 155 in the through hole 115, and is substantially equal to the height of the second engagement portion 151.

The first engagement portion 131 and the second engagement portion 151 are respectively exemplified as inner threads and outer threads, however it is to be noted that the present invention is not limited to such arrangement, and more importantly, the first engagement portion 131 and the second engagement portion 151 are primarily structured in a manner to be able to engaged with each other. Alternatively, in case the first engagement portion 131 comprises outer threads and the second engagement portion 151 comprises inner threads, the similar engagement effect can also be achieved. Consequently, besides the corresponding threads for being engaged with each other, the first engagement portion 131 and the second engagement portion 151 may also be shaped by other designs that can provide the engagement effect in the present invention.

Figure 3:
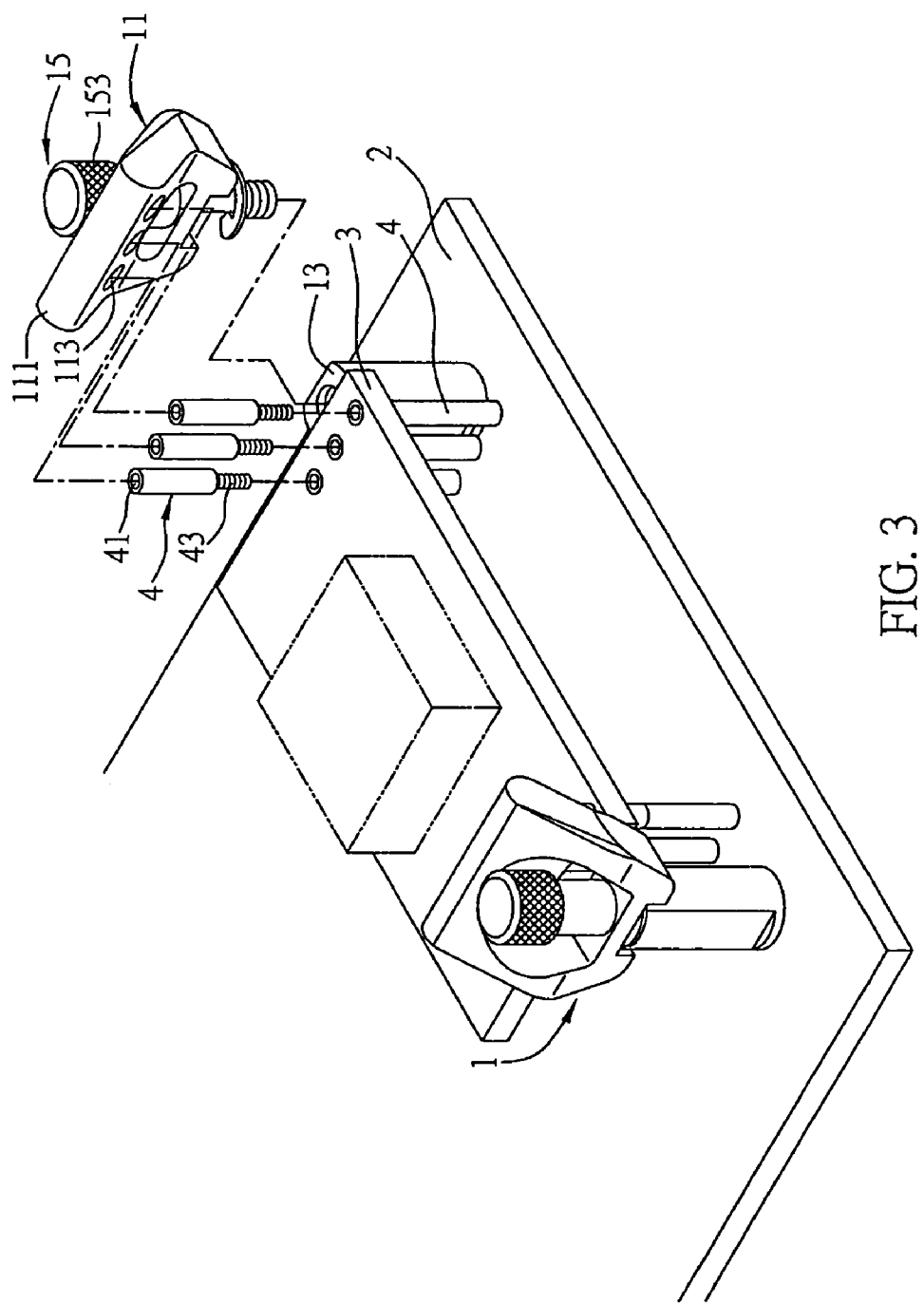
FIG. 3 is a schematic diagram showing an application of the circuit board clamping device according to the present invention.

FIG. 3 is a schematic diagram showing an application of the circuit board clamping device according to the present invention. As shown in FIG. 3, the circuit board clamping device 1 can be applied to a first circuit board 2 and a second circuit board 3 that are spaced from and stacked to each other, wherein the first circuit board 2 and the second circuit board 3 are spaced apart and fixed by a plurality of spacing posts 4. The first circuit board 2 can be a mainboard, and the second circuit board 3 can be a circuit board for promoting functionality of the mainboard. The spacing post 4 has a structure with a screw hole 41 at a top portion thereof and a screw 43 at a bottom portion thereof. The spacing posts 4 generally have various height specifications. For example, the spacing posts 4 having an appropriate height specification can be selected and used according to the height of components arranged on the first circuit board 2. The plurality of spacing posts 4 are disposed at corners or other appropriate positions between the first circuit board 2 and the second circuit board 3 and on the overlying second circuit board 3, so as to cooperatively support and fix the first circuit board 2 and the second circuit board 3. During assembly, for example, at least one spacing post 4 is firstly secured by its screw 43 to a through hole (having a screw nut on a bottom surface thereof or a metallic threaded tube pre-implanted therein) preformed in the first circuit board 2; and then after the second circuit board 3 is stacked on the spacing post 4, another spacing post 4 having the smallest height specification is used as a bolt and is secured to the screw hole 41 of the underlying spacing post 4 via its screw 43 penetrating a through hole preformed in the second circuit board 3, such that the assembly process is complete. Since the structural design and the assembly method of the spacing posts 4 are conventional in the art and are not a characteristic feature of the present invention to be claimed, which are thus not to be further detailed herein.

The circuit board clamping device 1 in the present invention is applied to the first circuit board 2 and the second circuit board 3 that have been spaced apart and stacked to each other by the aforementioned spacing posts 4. During operation, firstly the securing member 13 is vertically disposed on the first circuit board 2 (for example by screwing or welding) and adjacent to the plurality of spacing posts 4 at the same side. Then, the pressing member 11 is engaged via its recesses 113 with the spacing posts 4. The pressing member 11 is correspondingly disposed on the securing member 13, and the operating portion 153 of the forcing member 15 is rotated to make the second engagement portion 151 fully rotated into and secured to the first engagement portion 131 of the securing portion 13, such that the forcing member 15 is closely engaged with the securing member 13, and the spacing posts 4 are firmly pressed by the pressing member 11.

Figure 4:
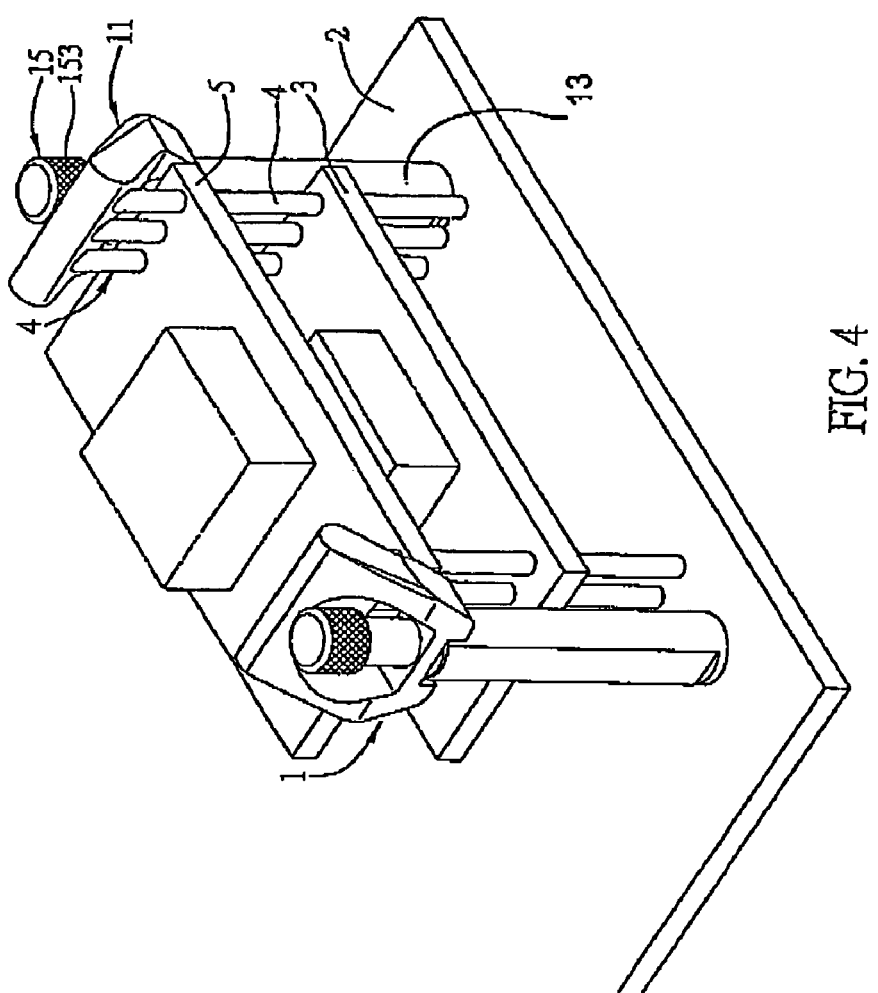
FIG. 4 is a schematic diagram showing another application of the circuit board clamping device according to the present invention.

Since the pressing member 11 and the securing member 13 are insulators and cover the spacing posts 4 made of for example copper, the first circuit board 2, the second circuit board 3 or components thereof can be prevented from short circuiting due to contact with spacing and securing elements such as the spacing members 4. Therefore, by the use of the circuit board clamping device 1 in the present invention, the two circuit boards are securely stacked and coupled to each other, and the two circuit boards or their components are prevented from short circuiting due to contact with the spacing and securing elements such as the spacing members 4; moreover, assembly and fixation of the circuit board clamping device 1 can be completed by simple rotating operation, thereby providing functions of convenient operation and easy assembly and disassembly. FIG. 4 is a schematic diagram showing another application of the circuit board clamping device according to the present invention. As shown in FIG. 4, this application differs from the previous application in FIG. 3 only in that a third circuit board 5 is additionally provided, whereas arrangement of the spacing posts 4 and assembly and operation of the circuit board clamping device 1 are all similar to those exemplified in FIG. 3. The application in FIG. 4 is provided to indicate that the securing member 13 can be made with various height specifications according to the design requirements so as to achieve the arrangement of stacking and spacing a plurality of circuit boards and also provide the similar functions as previously described that are not to be repeated herein.

For the circuit board clamping device in the present invention, at least two circuit boards can be securely stacked and coupled to each other by the pressing member pressing the spacing posts. Further, as the pressing member and the securing member are insulators and cover the spacing posts made of for example copper, the two circuit boards or their components can be prevented from short circuiting due to contact with spacing and securing elements such as the spacing members. Therefore, by the use of the circuit board clamping device in the present invention, the two circuit boards are securely stacked and coupled to each other, and the two circuit boards or their components are prevented from short circuiting due to contact with the spacing and securing elements such as the spacing members; moreover, assembly and fixation of the circuit board clamping device can be completed by simple rotating operation, thereby providing functions of convenient operation and easy assembly and disassembly. Consequently, the present invention can overcome the drawbacks of the conventional technology and has high industrial practicability.

The invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A circuit board clamping device applied to at least two spaced and stacked circuit boards, the two circuit boards being spaced apart and fixed by a plurality of spacing posts, the circuit board clamping device comprising:

a securing member for being disposed on one of the circuit boards and adjacent to the spacing posts, wherein the securing member has a first engagement portion on a top portion thereof;

a pressing member disposed on the securing member and for pressing the spacing posts, wherein the pressing member has a through hole; and a forcing member disposed on the pressing member, wherein a bottom portion of the forcing member has a second engagement portion for penetrating the through hole and being engaged with the first engagement portion.

2. The circuit board clamping device of claim 1, wherein the first engagement portion and the second engagement portion comprise first threads and second treads respectively to be engaged with each other.

3. The circuit board clamping device of claim 2, wherein the first threads are inner threads and the second threads are outer threads.

4. The circuit board clamping device of claim 1, wherein the securing member comprises a post structure, and the first engagement portion is located at a central position of the top portion of the securing member.

5. The circuit board clamping device of claim 4, wherein the securing member has two parallel cutting surfaces respectively at two lateral sides thereof.

6. The circuit board clamping device of claim 1, wherein the pressing member has a laterally extended pressing portion for pressing the spacing posts.

7. The circuit board clamping device of claim 6, wherein the pressing portion has at least one recess at a bottom surface thereof to be engaged with the spacing posts.

8. The circuit board clamping device of claim 1, wherein a fastening ring is provided between the second engagement portion of the forcing member and the bottom portion of the pressing member, for preventing separation of the forcing member from the pressing member.

9. The circuit board clamping device of claim 8, wherein the forcing member comprises a neck portion for being engaging with the fastening ring.

10. The circuit board clamping device of claim 1, wherein the forcing member comprises an operating portion located on the pressing member.

11. The circuit board clamping device of claim 10, wherein an outer surface of the operating portion is a rough surface.

12. The circuit board clamping device of claim 11, wherein the rough surface comprises an embossed structure.

13. The circuit board clamping device of claim 1, wherein the forcing member is a bolt having a head.

14. The circuit board clamping device of claim 1, wherein the securing member and the pressing member are insulators.

15. The circuit board clamping device of claim 1, wherein the securing member comprises an insulating tube with a screw nut being received therein.

* * * * *